(12) United States Patent
Lin et al.

(10) Patent No.: US 9,130,137 B2
(45) Date of Patent: Sep. 8, 2015

(54) LIGHT EMITTING ELEMENT AND LIGHT EMITTING MODULE THEREOF

(71) Applicant: DELTA ELECTRONICS, INC, Taoyuan Hsien (TW)

(72) Inventors: Li-Fan Lin, Taoyuan Hsien (TW); Shih-Peng Chen, Taoyuan Hsien (TW); Wen-Chia Liao, Taoyuan Hsien (TW); Ching-Chuan Shiue, Taoyuan Hsien (TW)

(73) Assignee: DELTA ELECTRONCS, INC., Taoyuan Hsien (TW)

(*) Notice: Subject to any disclaimer, the term of this patent is extended or adjusted under 35 U.S.C. 154(b) by 12 days.

(21) Appl. No.: 13/902,053

(22) Filed: May 24, 2013

(65) Prior Publication Data

US 2013/0313587 A1 Nov. 28, 2013

(30) Foreign Application Priority Data

May 24, 2012 (TW) .............................. 101118493 A

(51) Int. Cl.
*H01L 33/00* (2010.01)
*H01L 33/62* (2010.01)
*H01L 25/075* (2006.01)
*H01L 33/38* (2010.01)
*H01L 33/54* (2010.01)
*H01L 33/64* (2010.01)

(52) U.S. Cl.
CPC ............ *H01L 33/62* (2013.01); *H01L 25/0753* (2013.01); *H01L 33/382* (2013.01); *H01L 33/385* (2013.01); *H01L 33/54* (2013.01); *H01L 33/642* (2013.01); *H01L 2924/0002* (2013.01)

(58) Field of Classification Search
CPC ...... H01L 33/642; H01L 33/382; H01L 33/62; H01L 33/54; H01L 25/0753; H01L 2924/0002; H01L 2924/00
USPC ............................................................ 257/98
See application file for complete search history.

(56) References Cited

U.S. PATENT DOCUMENTS

| 8,319,246 | B2* | 11/2012 | Sugizaki ......................... 257/99 |
| 8,664,635 | B2* | 3/2014 | Jung et al. ....................... 257/13 |
| 8,882,313 | B2* | 11/2014 | Lin et al. ....................... 362/382 |
| 2006/0151793 | A1 | 7/2006 | Nagai |
| 2007/0284598 | A1* | 12/2007 | Shakuda et al. ................. 257/93 |
| 2008/0179602 | A1* | 7/2008 | Negley et al. .................... 257/88 |

(Continued)

FOREIGN PATENT DOCUMENTS

| TW | 200906287 A | 2/2009 |
| TW | M429709 U1 | 5/2012 |

*Primary Examiner* — Victor A Mandala
(74) *Attorney, Agent, or Firm* — Muncy, Geissler, Olds & Lowe, P.C.

(57) ABSTRACT

A light emitting element including an epitaxy layer, at least one first electrode, at least one second electrode, a first bonding pad and a second bonding pad. The epitaxy layer includes in sequence a first semiconductor layer, an active layer and a second semiconductor layer, and the first semiconductor layer has an exposed portion exposed from the second semiconductor layer and the active layer. The first electrode is disposed at the exposed portion. The second electrode is disposed at the second semiconductor layer. The first bonding pad is connected with the first electrode. The second bonding pad is connected with the second electrode. Two light emitting elements with different structures and the light emitting module utilizing the light emitting elements mentioned above are also disclosed.

16 Claims, 9 Drawing Sheets

(56) References Cited

U.S. PATENT DOCUMENTS

| | | | |
|---|---|---|---|
| 2008/0211416 A1* | 9/2008 | Negley et al. | 315/193 |
| 2009/0034275 A1 | 2/2009 | Cheng | |
| 2009/0309113 A1 | 12/2009 | Eichler | |
| 2010/0012968 A1 | 1/2010 | Yahata | |
| 2010/0163907 A1 | 7/2010 | Hsu | |
| 2010/0320488 A1* | 12/2010 | Horie | 257/91 |
| 2011/0073838 A1* | 3/2011 | Khan et al. | 257/13 |
| 2011/0073889 A1* | 3/2011 | Sugizaki et al. | 257/98 |
| 2011/0073900 A1* | 3/2011 | Sugizaki | 257/99 |
| 2011/0140160 A1 | 6/2011 | Kim | |
| 2011/0210311 A1 | 9/2011 | Kim | |
| 2012/0164796 A1* | 6/2012 | Lowenthal et al. | 438/127 |
| 2013/0234192 A1* | 9/2013 | Kim et al. | 257/98 |

\* cited by examiner

LIGHT EMITTING ELEMENT AND LIGHT EMITTING MODULE THEREOF

CROSS REFERENCE TO RELATED APPLICATIONS

This Non-provisional application claims priority under 35 U.S.C. §119(a) on Patent Application No(s). 101118493 filed in Taiwan, Republic of China on May 24, 2012, the entire contents of which are hereby incorporated by reference.

BACKGROUND OF THE INVENTION

1. Field of Invention

The invention relates to a light emitting element and module, and in particular, to an LED (light emitting diode) light emitting element and light emitting module that does not need the wire bonding.

2. Related Art

The purpose of packaging an LED (light emitting diode) is to ensure the correct electrical connection of the LED chip, and to protect the LED chip from being influenced by mechanical, thermal, humidity, and other external factors. A state-of-the-art LED packaging has diverse types in view of different applications, product appearances and sizes, heat dissipation solutions, and illumination effects.

The conventional LED packaging technology requires a package body to bear an LED die. However, since the package body has a smaller heat transfer coefficient, and the heat transfer coefficients of the LED die and the packaging body are different, the device may be damaged easily in a high-temperature environment.

Furthermore, the conventional manufacturing process of packaging connects an LED to a substrate or a lead frame by wire bonding. Such a wire bonding process connects the two ends of a gold or aluminum wire having a diameter of 25 μm to the chip and the substrate or the lead frame, respectively, by thermo-compression bonding, ultrasonic bonding or ultrasonic-assisted thermo-compression bonding. However, this process suffers from the problems of insufficient adhesion three of the wires on the die electrodes and the breakage of the wires. Moreover, the amount of light emitted by the LED is reduced due to the shield effect of the wires.

Another conventional packaging technique is flip-chip bonding, in which the die of a flip-chip LED is flipped and is bonded on a substrate directly without wire bonding. Since the light emitted is not shielded by the wires and electrodes, the light-emitting efficiency of the LED can be enhanced, while the heat conducting effect is also better. However, since the flip-chip LED is bonded to the substrate by die bonding, the sizes of the PN electrodes are limited to the size of the LED die. Therefore, die-bonding machine of high precision must be used during die-bonding, which the cost is expensive.

Therefore, it is desired to provide a light emitting element and a light emitting module that does not need wire bonding, does not need a packaging body, and is easy to be bonded, to solve the problems in the conventional art mentioned above.

SUMMARY OF THE INVENTION

In view of the foregoing, an objective of the present invention is to provide a light emitting element and a light emitting module that does not need wire bonding, does not need a packaging body, and is easy to be bonded, to solve the problems in the conventional art.

To achieve the above objective, the invention discloses a light emitting element, comprising an epitaxy layer, at least one first electrode, at least one second electrode, a first bonding pad and a second bonding pad. The epitaxy layer comprises in sequence a first semiconductor layer, an active layer and a second semiconductor layer. The first semiconductor layer has an exposed portion exposed from the second semiconductor layer and the active layer. The first electrode is disposed on the exposed portion, and the second electrode is disposed on the second semiconductor layer. The first bonding pad is connected to the first electrode, and the second bonding pad is connected to the second electrode.

To achieve the above objective, the invention also discloses a light emitting element, comprising a transparent conducting layer, an epitaxy layer, a second electrode, at least one first bonding pad and a second bonding pad. The epitaxy layer is disposed on the transparent conducting layer, and comprises in sequence a first semiconductor layer, an active layer and a second semiconductor layer. The second electrode is disposed on the second semiconductor layer. The first bonding pad is connected to the transparent conducting layer, and the second bonding pad is connected to the second electrode.

In one embodiment, the areas of the first and second bonding pads occupy more than 50% of the surface area of the light emitting element.

To achieve the above objective, the invention discloses a light emitting element, comprising an epitaxy layer, a plurality of first electrodes, a plurality of second electrodes, a first conducting trench and a second conducting trench. The epitaxy layer comprises in sequence a first semiconductor layer, an active layer and a second semiconductor layer. The first semiconductor layer has a plurality of exposed portions exposed from the second semiconductor layer and the active layer. The first electrodes are disposed on the exposed portions, and the second electrodes are disposed on the second semiconductor layer. The first and the second conducting trenches connect to the first and the second electrodes, respectively.

In one embodiment, the light emitting element further comprises an insulation layer disposed between the first and second electrodes.

In one embodiment, the first electrodes and/or the second electrodes have a reflective portion.

In one embodiment, the light emitting element further comprises a passivation layer covering a portion of the first semiconductor layer, a portion of the active layer and a portion of the second semiconductor layer. Moreover, the light emitting element further comprises a reflective layer covering the passivation layer.

In one embodiment, the epitaxy layer has an inclined surface, the area of the second semiconductor layer is smaller than that of the active layer, and the area of the active layer is smaller than that of the first semiconductor layer.

In one embodiment, the light emitting element further comprises a substrate, and the epitaxy layer is disposed at the substrate. Herein, the surface of the epitaxy layer and/or the substrate has a roughened structure.

In one embodiment, the light emitting element further comprises a light transforming layer, and the epitaxy layer is disposed at the light transforming layer.

In one embodiment, the light emitting element further comprises a light transforming layer, and the light transforming layer covers the epitaxy layer, the first bonding pad and the second bonding pad, or the transparent conducting layer, the epitaxy layer, the first bonding pad and the second bonding pad, or the epitaxy layer, the first conducting trench and the second conducting trench.

In one embodiment, the light emitting element further comprises a first extending pad and a second extending pad, wherein the first extending pad is connected to the first bonding pad or the first conducting trench, and the second extending pad is connected to the second bonding pad or the second conducting trench. The light emitting element further comprises a lens covering the epitaxy layer and a substrate.

To achieve the above objective, the invention further discloses a light emitting module, comprising a plurality of light emitting elements and a circuit board. The light emitting elements are the light emitting elements according to any of the above-mentioned embodiments. The circuit board has a circuit structure. The first bonding pads and the second bonding pads, or the first conducting trenches and the second conducting trenches, of the light emitting elements are disposed at the circuit board and are electrically connected to the circuit structure.

In one embodiment, one of the light emitting elements is serially coupled with another of the light emitting elements through the first and the second bonding pads, or the first and the second conducting trenches.

In one embodiment, the light emitting module further comprises a plurality of lenses, and the lenses are disposed on the circuit board corresponding to the light emitting elements.

To achieve the above objective, the invention discloses a light emitting module, comprising a plurality of light emitting elements and a circuit board. The light emitting elements are the light emitting elements according to any of the above-mentioned embodiments. The circuit board has a circuit structure. The first and the second bonding pads or the first and the second conducting trenches of the light emitting elements are disposed at the circuit board and are electrically connected to the circuit structure.

In one embodiment, one of the light emitting elements is serially coupled to another of the light emitting elements through the first and the second bonding pads, or the first and the second conducting trenches.

In one embodiment, the light emitting module further comprises a plurality of lenses, and the lenses are disposed on the circuit board corresponding to the light emitting elements.

As mentioned above, the light emitting elements and the light emitting module utilizing the same first and second bonding pads, or the first and the second conducting trenches, with large areas directly couple to a circuit board or a heat sink to achieve the objectives of enhancing heat conducting efficiency and simplifying the manufacturing process.

Compared to the prior art, the light emitting element and the light emitting module of the present invention do not need wire bonding, thus do not have the risk of insufficient adhesion force of the wires or the breakage of the wires, and do not have the disadvantage of reduced light emitting amount due to the shield effect of the wires. Compared to the conventional flip-chip light emitting element, the light emitting element according to the present invention can be bonded to a circuit board or a heat sink directly without using an expansive and high-precision die-bonding machine. Furthermore, the light emitting element according to the present invention does not need a package body of a plastic shell. Therefore, it can be miniaturized without size limitation, and does not suffer from the reliability issues due to the aging of the plastic shell (such as PPA, LCP, etc.).

Moreover, the variations of the structures of the light emitting elements of different embodiments or aspects can further enhance the light emitting efficiency, increase the light emitting brightness, or simplify the assembly process. Light emitting elements of different colors can also be formed.

BRIEF DESCRIPTION OF THE DRAWINGS

The present invention will become more fully understood from the subsequent detailed description and accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
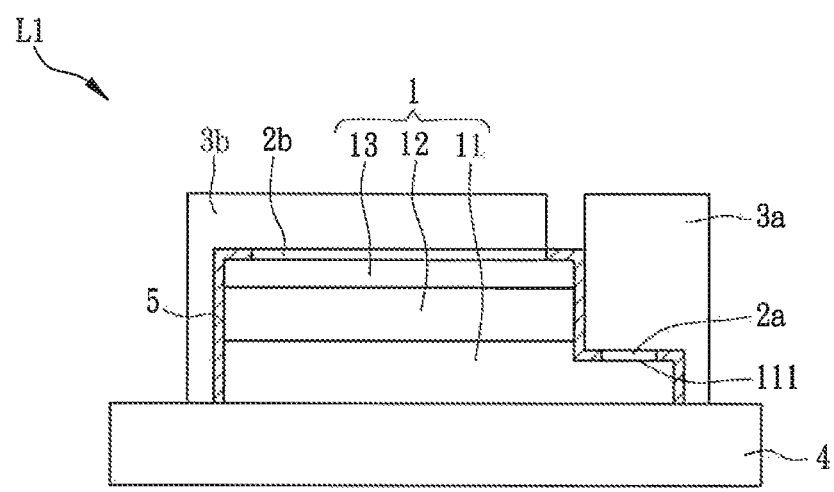
FIG. 1 is a sectional schematic diagram showing a light emitting elements according to a first preferred embodiment of the invention.

FIG. 1 is a sectional schematic diagram showing a light emitting element L1 according to a first preferred embodiment of the invention. As shown in the drawing, the light emitting element L1 includes an epitaxy layer 1, at least one first electrode 2a, at least one second electrode 2b, a first bonding pad 3a and a second bonding pad 3b. Here, the light emitting element L1 is an LED (light emitting diode) as the light source.

The epitaxy layer 1 includes, in sequence, a first semiconductor layer 11, an active layer 12, and a second semiconductor layer 13. By etching the active layer 12 and the second semiconductor layer 13, the first semiconductor layer 11 has an exposed portion 111 to expose a portion of the first semiconductor layer 11 from the active layer 12 and the second semiconductor layer 13. The first semiconductor layer 11 and the second semiconductor layer 13 may be an N-type epitaxy layer and a P-type epitaxy layer, respectively. The types of the first semiconductor layer 11 and the second semiconductor layer 13 may be exchanged alternatively; the invention is not limited herein. In the present embodiment, the epitaxy layer 1 may be grown or provided on a substrate 4. The substrate 4 may be an insulating transparent substrate, such as, for example, a sapphire substrate.

The first electrode 2a is disposed on the exposed portion 111 of the first semiconductor layer 11. The second electrode 2b is disposed on the second semiconductor layer 13. Generally, the first and the second electrodes 2a, 2b are disposed on another side of the epitaxy layer 1 with respect to the substrate 4 to form an ohmic contact. In the present embodiment, the substrate 4 is the light emitting surface of the light emitting element L1. The first electrode 2a and/or the second electrode 2b may have a reflective portion (not shown), such as, but not limited to, a metal layer formed by electroplating, to reflect the light emitted by the epitaxy layer 1 to enhance the brightness of the light emitting surface, i.e. the substrate 4.

The first and the second bonding pads 3a, 3b can be formed by vapor deposition or electroplating. The first and the second bonding pads 3a, 3b are connected to the first and the second electrodes 2a, 2b, respectively. Herein, the areas of the first and the second bonding pads 3a, 3b occupy more than 50% of the surface area of the light emitting element L1. By connecting the first bonding pad 3a to the first electrode 2a and the second bonding pad 3b to the second electrode 2b, PN contact electrodes of larger areas can be formed, so that the light emitting element L1 can be bonded to a circuit board directly without using a high-precision die-bonding machine.

Herein, the light emitting element L1 may further include a passivation layer 5, which covers a portion of the first semiconductor layer 11, a portion of the active layer 12 and a portion of the second semiconductor layer 13 to prevent oxidation or inadvertently touch. The material of the passivation layer 5 can be, but not limited to, silicon nitride, silicon dioxide, polymer, benzocyclobutene (BCB) or photoresist.

Figure 2A:
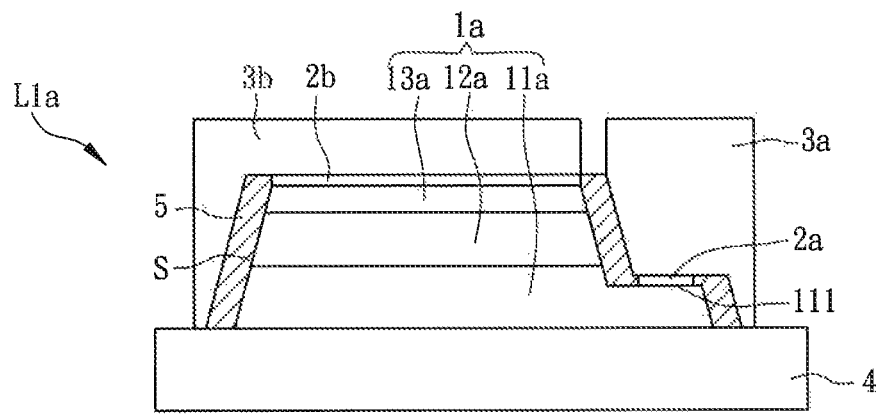
FIGS. 2A to 2E are light emitting elements of different aspects according to the first embodiment of the invention.

FIGS. 2A to 2E are light emitting elements of different aspects according to the first embodiment of the invention. As shown in FIG. 2A, the epitaxy layer 1a includes a first semiconductor layer 11a, an active layer 12a, and a second semiconductor layer 13a. Compared to the first embodiment shown in FIG. 1, the side edge of the epitaxy layer 1a has an inclined surface S, and the disposition area of the second semiconductor layer 13 is smaller than that of the active layer 12a. The disposition area of the active layer 12a is even smaller than that of the first semiconductor layer 11a. In other words, the closer to the light emitting surface (the substrate 4), the larger the disposition area of the layer is. Therefore, the light emitting area is increased, and the light emitting efficiency of the light emitting element L1a is enhanced.

Figure 2B:
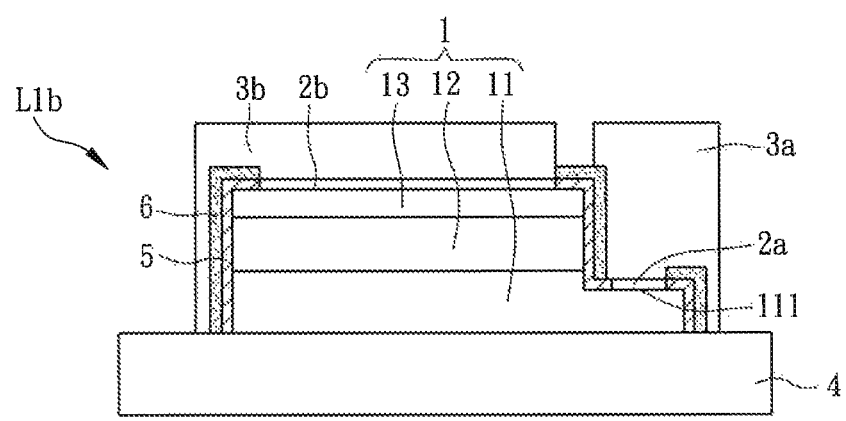

Referring to FIG. 2B and compared to the embodiment shown in FIG. 1, the light emitting element L1b further includes a reflective layer 6 covered the passivation layer 5. The reflective layer 6 can be a metal layer formed by electroplating, and the material can be the same to the reflective portion (not shown) of the first and the second electrodes 2a, 2b. The reflective layer 6 is provided to reflect the light emitted by the epitaxy layer 1, so that the light is emitted from the light emitting surface, i.e. the substrate 4.

Figure 2C:
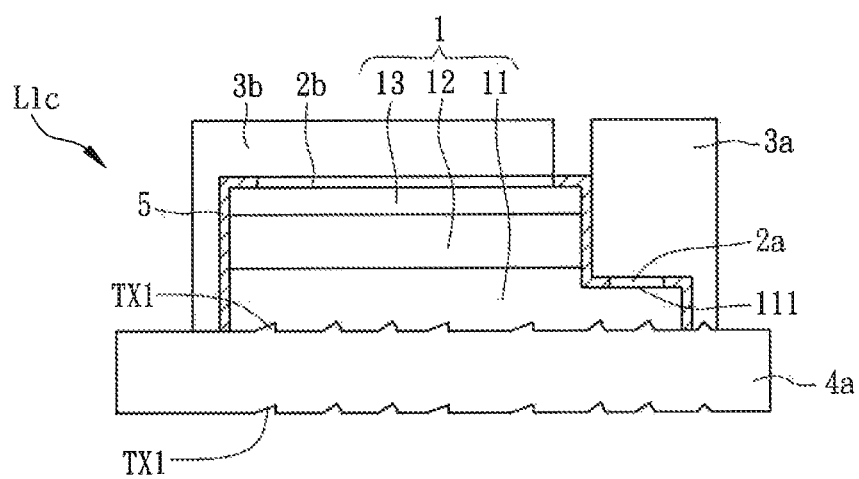
Figure 2D:
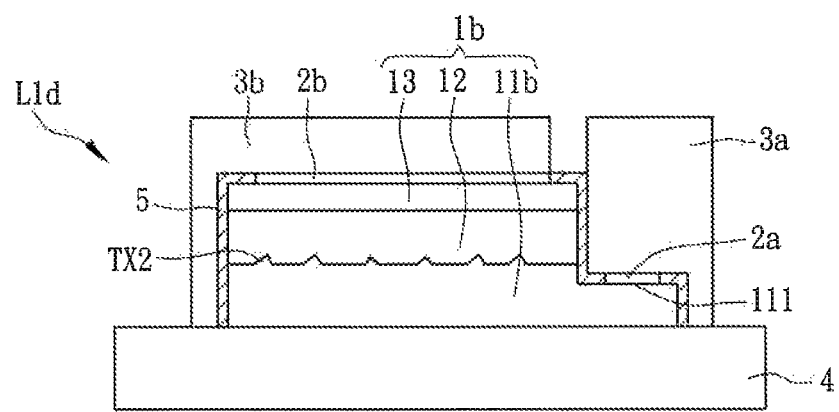

FIGS. 2C and 2D show light emitting elements L1c and L1d, respectively. As shown in FIG. 2C, the surface, including the upper surface and/or the bottom surface, of the substrate 4a has roughened structure TX1. As shown in FIG. 2D, the epitaxy layer 1b includes a first semiconductor layer 11b, an active layer 12, and a second semiconductor layer 13. Any layer of the epitaxy layer 1b has roughened structure TX2. Here the first semiconductor 11b is taken as example. Compared to a smooth surface, after the light impinging onto the surface having roughened structures TX1 and TX2 several times, the light impinging onto the surface with an angle smaller than the critical angle of the Snell's law can be increased significantly. With such effect, the light emitting efficiency of the light emitting elements L1c and L1d can be enhanced.

Figure 2E:
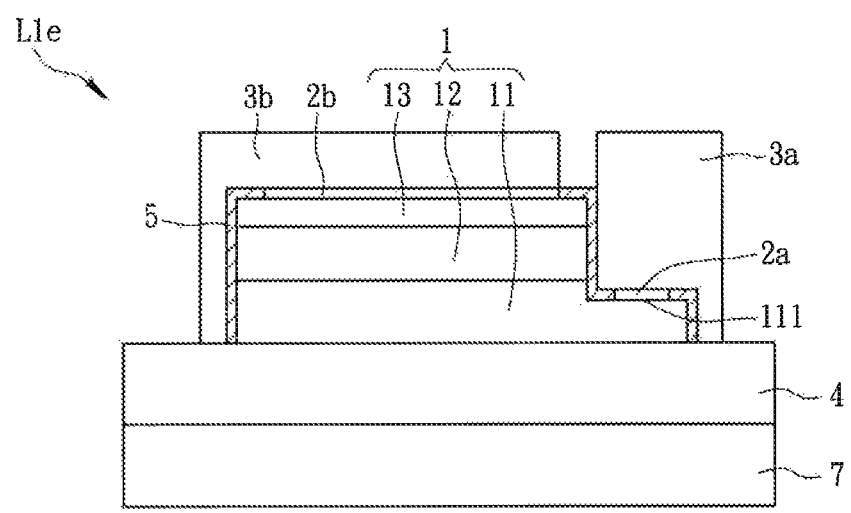

Compared with FIG. 1, the light emitting element L1e shown in FIG. 2E further includes a light transforming layer 7. Through the transforming layer 7, light emitted from the epitaxy layer 1 can be transformed into different colors. The epitaxy layer 1 is disposed on the substrate 4, as shown in FIG. 2E, or optionally disposed on the light transforming layer 7 directly. If the epitaxy layer 1 is disposed on the transforming layer 7 directly, the substrate 4 must be removed after forming the epitaxy layer 1 by laser lift-off, etching or CMP (chemical mechanical polishing), and then forming the light transforming layer 7 on the epitaxy layer 1. The light transforming layer 7 can be formed by spraying, adhesive dripping, bonding or laminating, and its material may be, but not limited to, MQWs (multiple quantum well), ceramic phosphor, phosphor in glass, or quantum dots phosphor.

It should be noted that although each of the FIGS. 2A to 2E only show one of the aspects of the first embodiment respectively, all aspects may be implemented in the same embodiment when implementing in practice. The invention is not limited herein.

FIGS. 3A to 3D are light emitting elements according to the second preferred embodiment of the invention. Compared with FIG. 1, the light emitting element L2a shown in FIG. 3A further includes a tape T. A first bonding pad 3a and a second bonding pad 3b are disposed on the tape T. The tape T can, for example, a heat-removal tape, which adhesively fixes a portion of the structure temporarily. When heat is applied to reduce the adhesive, the portion of the structure can be removed easily to proceed with subsequent manufacturing processes. Here, the structure of the light emitting element L1 shown in FIG. 1 is taken as the basis of the subsequent variations. Of course, the aspects of the light emitting elements shown in FIGS. 2A to 2E can also be used here.

Figure 3A:
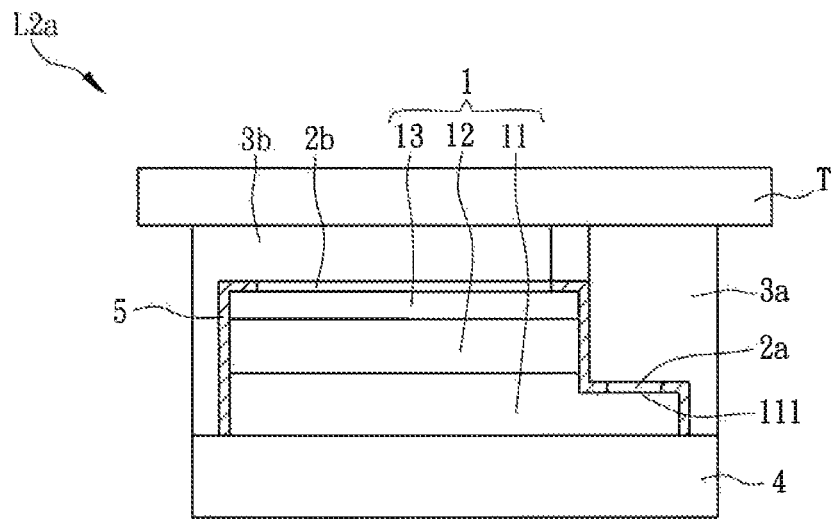
FIGS. 3A to 3D are light emitting elements according to the second preferred embodiment of the invention.
Figure 3B:
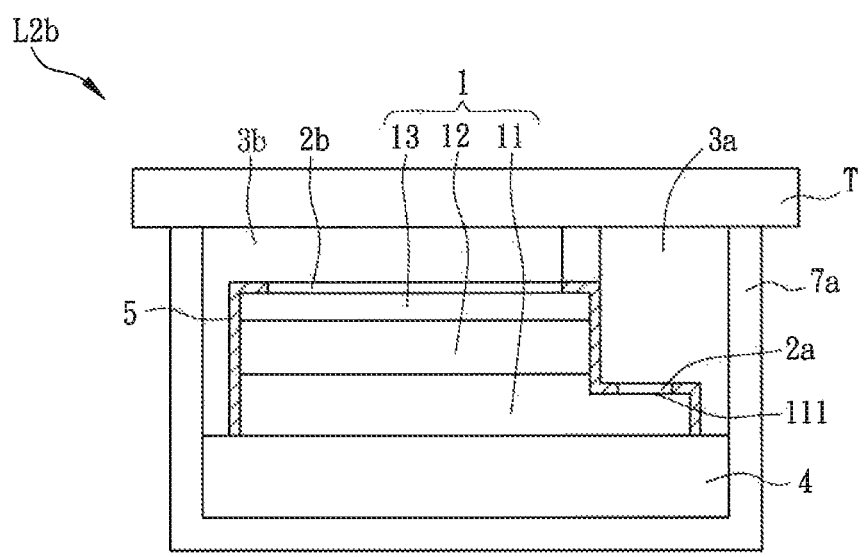

Except for the tape T, the light emitting element L2b shown in FIG. 3B further includes a light transforming layer 7a when compared with FIG. 3A. The difference is that the light transforming layer 7a is not only disposed at one surface of the substrate 4 or the epitaxy layer 1, but covers the epitaxy layer 1, the first bonding pad 3a, and the second bonding pad 3b. The material of the light transforming layer 7a can be the same or different to that of the light transforming layer 7, and can be formed by the same or different processes. In the same embodiment, the light transforming layer 7a and the light transforming layer 7, as shown in FIG. 2E but not shown in FIG. 3B, can be both included. The wavelengths of the light transformed by the light transforming layer 7a and the light transforming layer 7 can be the same or different in order to adjust the color of the light emitted by the light emitting element L2b.

Figure 3C:
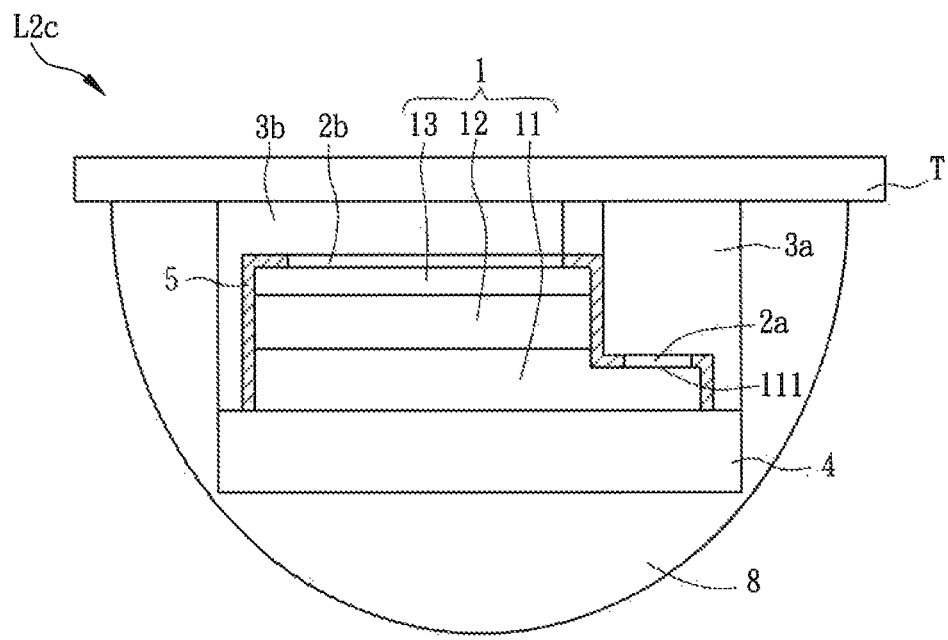

Compared with FIG. 3A, the light emitting element L2c shown in FIG. 3C further includes a lens 8 disposed on the tape T. The structures of the epitaxy layer 1, the first electrode 2a, the second electrode 2b, the first bonding pad 3a, the second bonding pad 3b and the substrate 4 are accommodated between the lens 8 and the tape T. Generally, the structure of the light emitting element L2c is formed by using the lens 8 and the tape T together to package the light emitting element L1 shown in FIG. 1. The material of the lens 8 can be silicone resin, and can be disposed and formed by molding or bonding. Fluorescent powders can be added to the lens 8 during the forming process so that the lens 8 is formed as a fluorescent lens to perform light wavelength transformations.

Figure 3D:
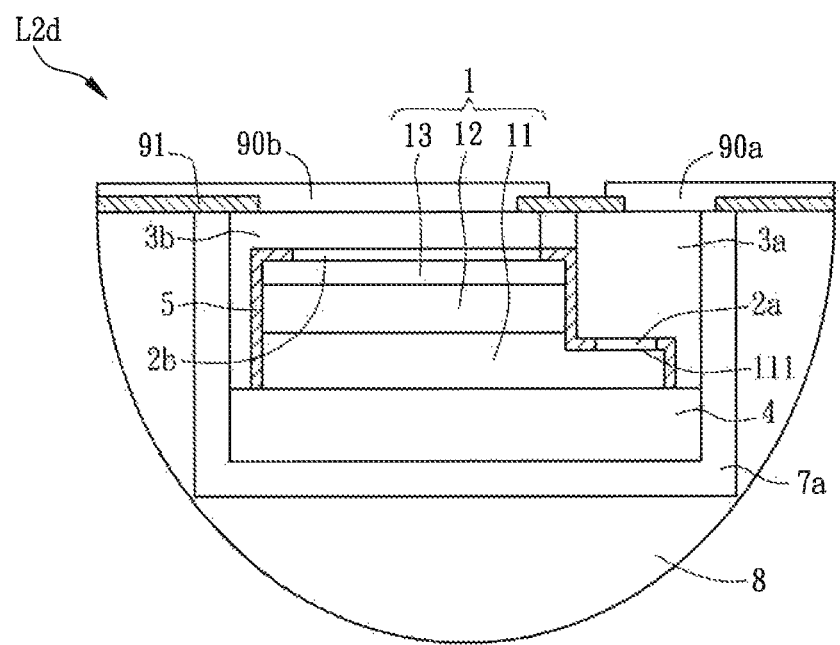

It is noteworthy that if the light emitting element has both the light transforming layer 7a and the fluorescent lens 8, the different fluorescent powders be applied therein to design the color of the light after being transformed and mixed. As shown in FIG. 3D, the light emitting element L2d includes a light transforming layer 7a and a fluorescent lens 8. Therefore, the above-mentioned effect can be achieved. The lens 8 of the present embodiment covers the epitaxy layer 1, the substrate 4 and the light transforming layer 7a. Moreover, the light emitting element L2d shown in FIG. 3D further includes a first and a second extending pads 90a, 90b. The first and the second extending pad 90a, 90b are connected to the first and the second bonding pads 3a, 3b, respectively. An insulation layer 91 is disposed between the first and the second extending pads 90a, 90b to ensure the correct electrical connections therebetween. The first and the second extending pads 90a, 90b are extending electrodes of large areas. The light emitting element L2d can be coupled with another electronic device (not shown), such as a power source or another light emitting element, serially or in parallel.

Figure 4:
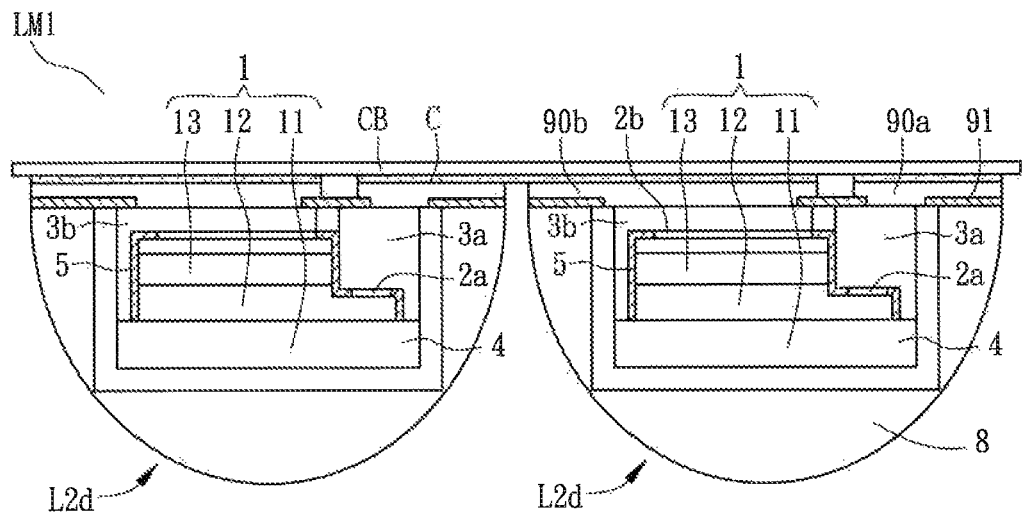
FIGS. 4 and 5 are sectional schematic diagrams of the third preferred embodiment of the invention.
Figure 5:
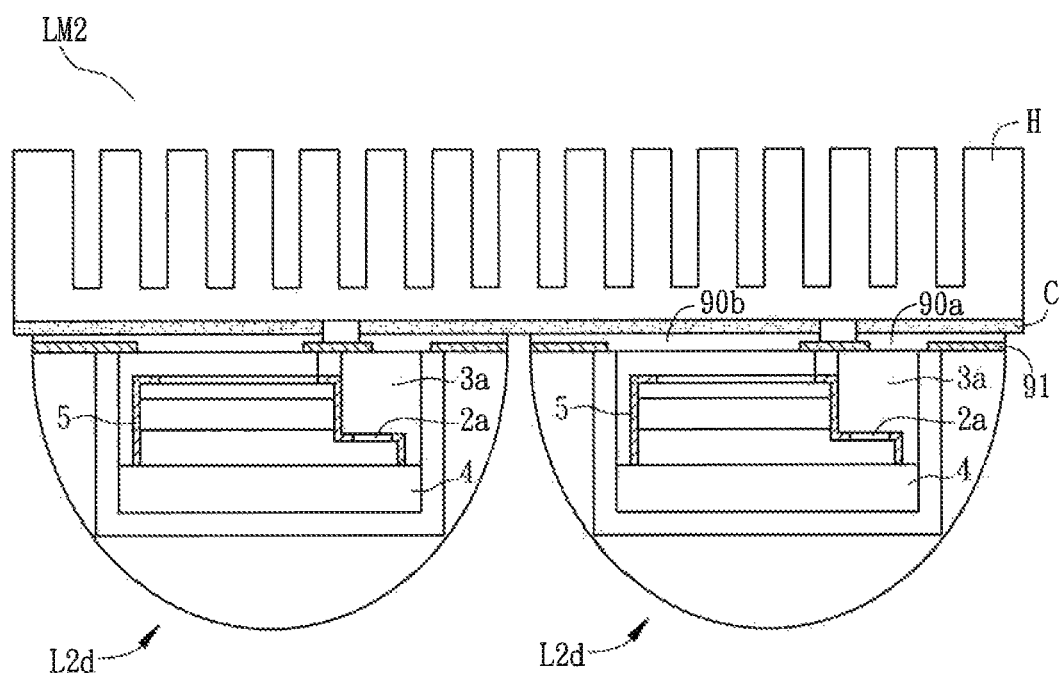

FIGS. 4 and 5 are sectional schematic diagrams of the third preferred embodiment of the invention, and respectively show the light emitting module LM1 and LM2 implementing the light emitting element L2d mentioned above.

The light emitting module LM1 includes a plurality of light emitting elements L2d and a circuit board CB. The number of the light emitting elements L2d is two as an example. Note that the light emitting elements L2d can be any light emitting element according to any one of the embodiments or aspects mentioned above, and the invention is not limited herein. The circuit board CB and the light emitting elements L2d are electrically connected, and the electrical relationships between the light emitting elements L2d are coupled serially or in parallel by the circuit structure C of the circuit board CB. Generally, the circuit board CB has a pre-configured circuit structure C. The first and the second bonding pads 3a, 3b of the light emitting elements L2d are electrically connected to the circuit structure C through the first and second extending pads 90a, 90b, respectively, to dispose the light emitting elements L2d on the circuit board CB. The first electrode 2a of the light emitting element L2d on the left side and the second electrode 2b of the light emitting element L2d on the right side are electrically connected through the first bonding pad 3a, the first extending pad 90a, the circuit structure C, the second extending pad 90b and the second bonding pad 3b. The serial and parallel connections of the light emitting elements L2d in the light emitting module LM1 can be accomplished analogically.

The light emitting module LM2 includes a plurality of light emitting elements L2d and a heat sink H. Although two light emitting elements L2d are included here as an example, the light emitting elements L2d can be the light emitting elements according to any of the embodiments or aspects mentioned above. The invention is not limited herein. The heat sink has a pre-configured circuit structure C. The first and the second bonding pad 3a, 3b are disposed on the heat sink H, and are electrically connected to the circuit structure C through the first and the second extending pads 90a, 90b, respectively. Similar to the light emitting module LM1, one light emitting element L2d can be coupled serially or in parallel to another light emitting element L2d through the circuit structure C.

Here, an insulation layer 91 can be included between the first and the second extending pads 90a, 90b and the first and second bonding pads 3a, 3b of the light emitting element L2d within the light emitting modules LM1, LM2.

Since the light emitting modules LM1 and LM2 mentioned above are directly coupled to the circuit board CB or the heat sink H without dissipating heat through the substrate 4 or the light transforming layer 7, the heat conducting efficiency of the light emitting modules LM1 and LM2 is significantly enhanced due to the characteristic of a low thermal resistance.

Figure 6:
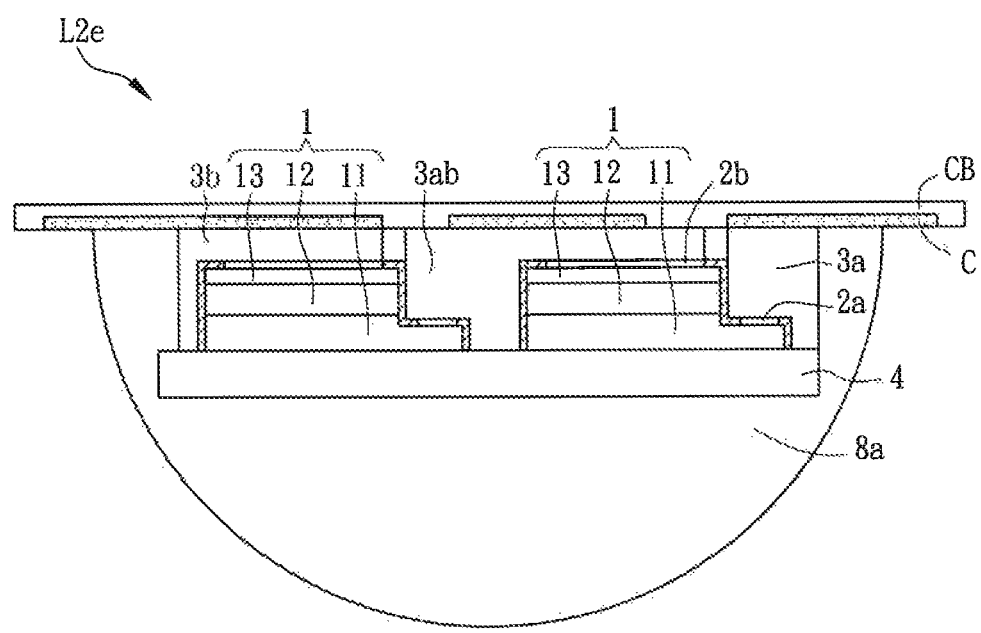
FIG. 6 is a sectional schematic diagram of a different aspect of the light emitting element according to the second preferred embodiment of the invention.

FIG. 6 is a sectional schematic diagram of a different aspect of the light emitting element L2e according to the second preferred embodiment of the invention. As shown in FIG. 6, in the light emitting element L2e, the first bonding pad 3a of one light emitting element is coupled to the first bonding pad 3b of another light emitting element, or a serial bonding pad 3ab is formed directly between the first electrode 2a of one light emitting element and the second electrode 2b of another light emitting element, the lens 8a can once package two light emitting elements coupled with each other at the circuit board CB to form the light emitting element L2e. With such design, the cost of the lens 8a can be reduced. Noted that the invention does not limit the number of the light emitting elements coupled serially or in parallel using the serial bonding pad 3ab. Although two light emitting elements are used as an example, more light emitting elements may be serially coupled.

Figure 7A:
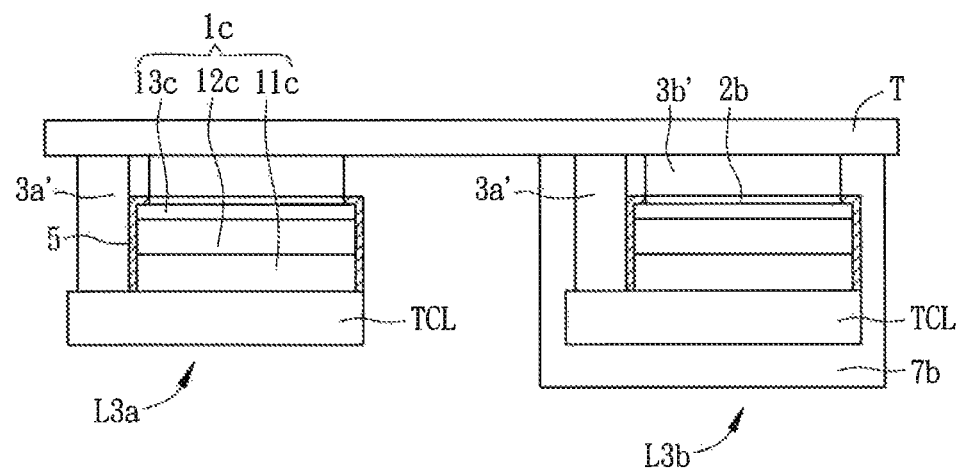
FIG. 7A is a sectional schematic diagram of a different aspect of the light emitting element according to the fourth preferred embodiment of the invention.

FIG. 7A is a sectional schematic diagram of a different aspect of the light emitting element according to the fourth preferred embodiment of the invention. Referring to FIG. 7A, in the present embodiment, the light emitting element L3a includes a transparent conducting layer TCL, an epitaxy layer 1c, a second electrode 2b, at least one first and second bonding pad 3a', 3b'. After the substrate on which the epitaxy layer 1c is grown is removed, the epitaxy layer 1c can be disposed on the transparent conducting layer TCL. The epitaxy layer 1c includes in sequence a first semiconductor layer 11c, an active layer 12c and a second semiconductor layer 13c. The second electrode 2b is disposed on the second semiconductor layer 13c.

Compared with the light emitting element L2a of the second embodiment, the insulated substrate 4 of the light emitting element L2a is substituted by the transparent conducting layer TCL of the light emitting element L3a. Therefore, in the present embodiment, the first semiconductor layer 11c can be electrically connected by connecting at least one of the first bonding pad 3a' to the transparent conducting layer TCL. Also, the second bonding pad 3b' is connected to the second electrode 2b.

Although the first and the second bonding pads 3a', 3b' of the light emitting element L3a are both located at the same surface of the light emitting element, the electrodes, i.e. the second electrode 2b and the transparent conducting layer TCL, of the present embodiment are substantially located at different surfaces of the light emitting element L3a. Therefore, in the present embodiment, the current inside the epitaxy layer 1c passes each portion of the epitaxy layer 1c perpendicularly in straight lines. Compared with the forementioned embodiments, since the positive and negative electrodes of the light emitting element mentioned previously are disposed at the same surface, the current must be changed from flowing perpendicularly to flowing horizontally and concentrated at the turning point when passing through the first semiconductor layer 11, which results in that the a portion of the electron layer and the hole layer of the P-N junction cannot be utilized effectively. This reduces the light emitting efficiency. Furthermore, more heat is generated at the turning point of the current, which extends the scope of lattice defects and thus reduce the brightness and the lifespan of the light emitting element. To extend the lifespan of the light emitting element, the current entering into the light emitting element must be reduced, which further limits the brightness of the light emitting element. Generally, the uniform distribution of the current within the light emitting element L3a enhances the brightness of the light emitting element L3a significantly.

Since the variations of the epitaxy layer 1c, the second electrode 2b, the first and the second bonding pads 3a', 3b' are the same to those described in the previously embodiments, the details are omitted here for concise purpose. The variations can be analogized by referring to the varied aspects of the first and the second embodiments with the light emitting element L3a shown in FIG. 7A as the basic structure. For example, the light emitting element L3b may further include a light transforming layer 7b, which is similar to the light transforming layer 7a shown in FIG. 3B. The light transforming layer 7b covers the transparent conducting layer TCL, the epitaxy layer 1c, the first and the bonding pads 3a', 3b'.

Figure 7B:
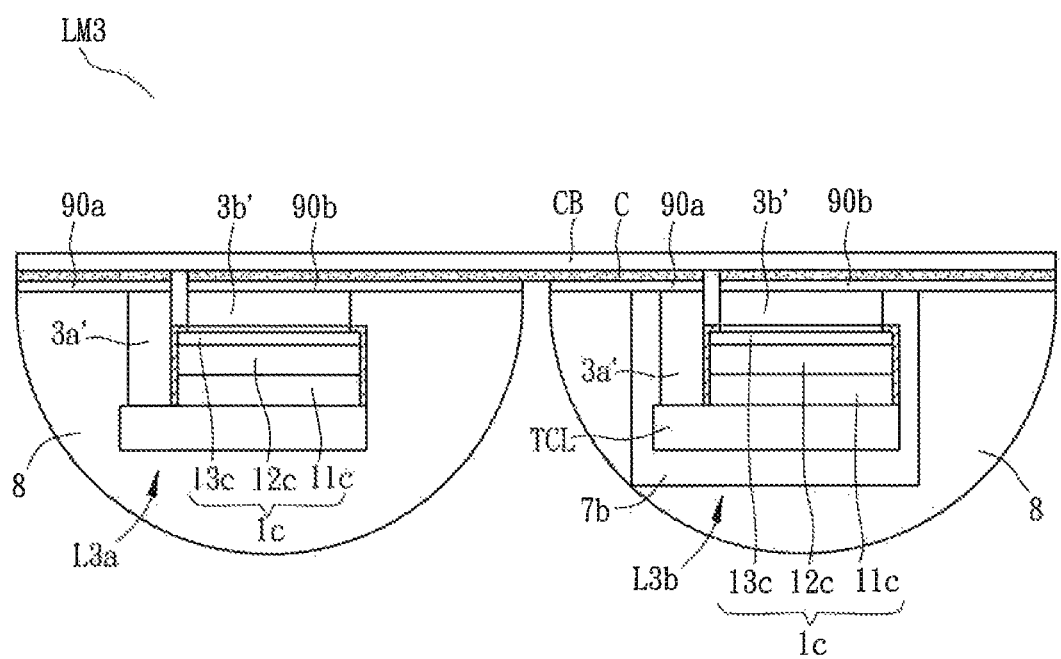
FIG. 7B is a sectional schematic diagram of the light emitting element according to the fourth preferred embodiment of the invention utilized in a light emitting module.

FIG. 7B is a sectional schematic diagram of the light emitting element LM3 according to the fourth preferred embodiment of the invention utilized in a light emitting module. FIG. 7B shows a light emitting modules LM1, LM3 utilizing the light emitting element L3a mentioned above. Similar to the light emitting modules LM1, LM2 in the third preferred embodiment, the light emitting module LM3 can include a light emitting element and a circuit board CB having a circuit structure C. Here two light emitting elements L3a, L3b are included as an example. In the present embodiment, two light emitting elements L3a, L3b further include, respectively, a first extending pad 90a, a second extending pad 90b and a lens 8, wherein the first and the second extending pads 90a, 90b of the light emitting elements L3a, L3b are electrically connected to the circuit structure C, respectively.

Figure 8A:
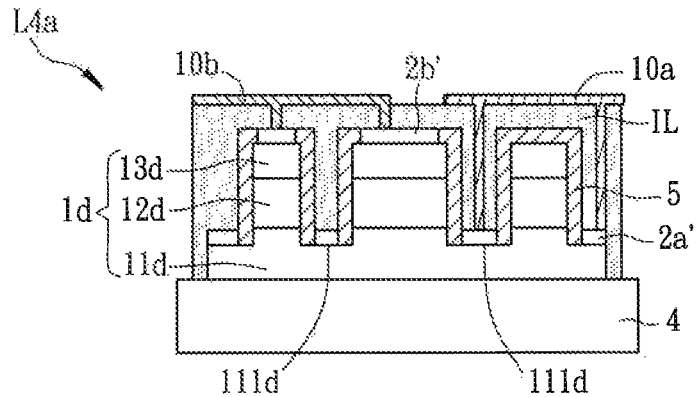
FIGS. 8A and 8B are sectional schematic diagrams of different aspects of the light emitting elements according to the fifth preferred embodiment of the invention.
Figure 8B:
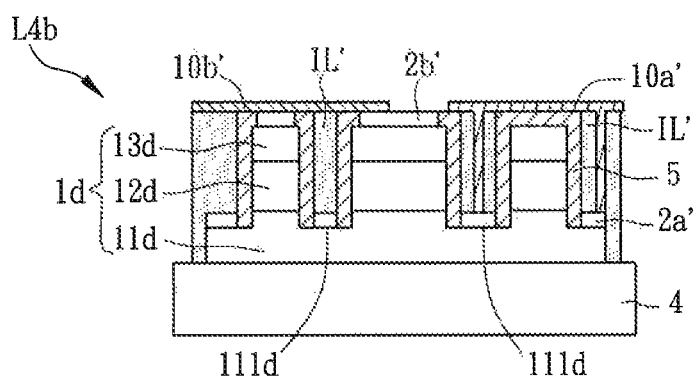

FIGS. 8A and 8B are sectional schematic diagrams of different aspects of the light emitting elements L4a and L4b according to the fifth preferred embodiment of the invention.

As shown in FIG. 8A, the light emitting element Ma includes a epitaxy layer 1d, a plurality of first electrode 2a', a plurality of second electrode 2b', a first conducting trench 10a and a second conducting trench 10b.

The epitaxy layer 1d includes, in sequence, a first semiconductor layer 11d, an active layer 12d and a second semiconductor layer 13d. The first semiconductor layer 11d has a plurality of exposed portions 111d exposed from the second semiconductor layer 13d and the active layer 12d by etching portions of the active layer 12d and the second semiconductor layer 13d. Here, although the light emitting element Ma has four exposed portions 111d, two first electrodes 2a' and two second electrode 2b' as an example, the invention is not so limited by the numbers of the exposed portion 111d, the first electrode 2a' and the second electrode 2b'. Herein, the two first electrodes 2a' are disposed at two of the exposed portions 111d, and the second electrodes 2b' are disposed at the second semiconductor layer 13d.

The first and the second conducting trenches 10a, 10b are formed of electrically conducting material, and preferably have reflective portions (not shown) such as metallic coating layers. The first conducting trench 10a connects two first electrodes 2a' and the second conducting trench 10b connects two second electrodes 2b'.

Furthermore, an insulation layer IL can be provided between the first and the second conducting trenches 10a, 10b and the epitaxy layer 1d to insulate the first and the second conducting trenches 10a, 10b, and the first and the second electrodes 2a', 2b'. Herein, the insulation layer IL covers the epitaxy layer 1d completely. The insulation layer IL may be made of material such as silicon oxide, silicon nitride, SOI (silicon-on-insulator), polymer, benzocyclobutene (BCB), photoresist, or silicon oxide resin.

According to the light emitting element L4a utilized in the present embodiment, the current inside the epitaxy layer 1d is not passing through the epitaxy layer 1d perpendicularly in straight lines. However, since the light emitting element L4a of the present embodiment has a plurality of exposed portions 111d, a plurality of first electrodes 2a' and a plurality of second electrodes 2b', the distribution of the internal current is more uniform. Compared to previous embodiments, although the current passing through the first semiconductor layer 11 is still curved, since the electrons and the holes that cannot be utilized are reduced, the light emitting efficiency of the light emitting element L4a can be enhanced.

Furthermore, the aspect of the insulation layer IL', the first conducting trench 10a' and the second conducting trench 10b' of the light emitting element L4b shown in FIG. 8B is different from the light emitting element L4a shown in FIG. 8A.

Herein, the height of the insulation layer IL' is the same as the height of the epitaxy layer 1d. Of course, in other aspects, the height of the insulation layer IL' may be lower than the height of the epitaxy layer 1d. This reduces the usage of the insulation layer IL', the first conducting trench 10a' and the second conducting trench 10b', and makes the manufacturing process more simple.

It should be noted that although the first conducting trenches 10a, 10a' and the second conducting trenches 10b, 10b' are in the shape of lines when viewed from the sectional diagram, they can be conducting line or sheet-shaped metals. Moreover, the invention is not limited by the widths of the first conducting trenches 10a, 10a' and the second conducting trenches 10b, 10b'. The portions of the trenches extending to the first and the second electrodes 2a', 2b' may be narrow trenches as shown in FIG. 8A, or have widths similar to, or even the same to, the widths of the first and the second electrodes 2a', 2b' to increase the electrical conducting areas of the first conducting trenches 10a, 10a' and the second conducting trenches 10b, 10b'.

Moreover, the other aspects of the present embodiment can be varied with reference to the embodiments mentioned previously. For example, the epitaxy layer 1d may has a inclined surface or a roughened structure (not shown), the substrate 4 may be removed (not shown), the light transforming layer may be further included (not shown), the first and the second extending pads can be further included (not shown), a fluorescent lens can be further included (not shown).

Figure 8C:
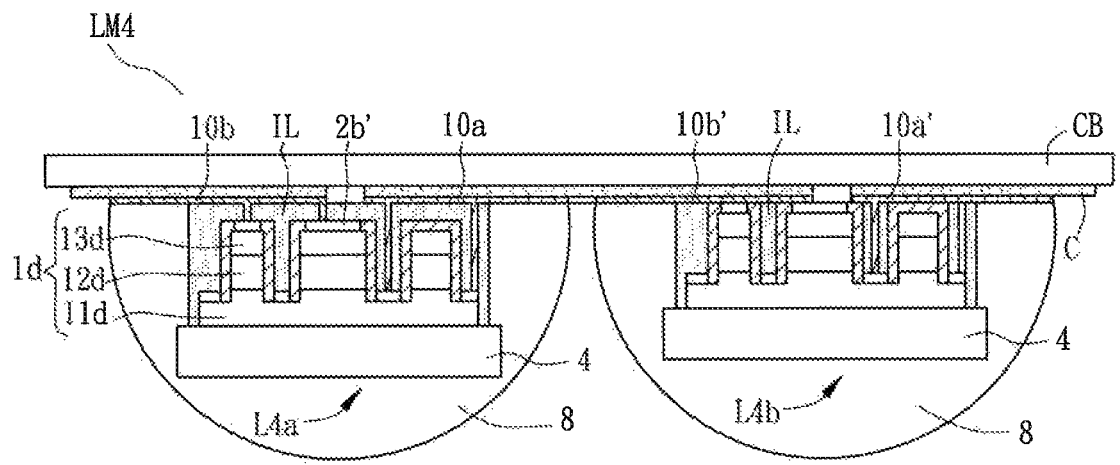
FIG. 8C is a sectional schematic diagram of the light emitting elements according to the fifth preferred embodiment of the invention utilized in a light emitting module.

FIG. 8C is a sectional schematic diagram of the light emitting elements L4a, L4b according to the fifth preferred embodiment of the invention utilized in a light emitting module LM4. Referring to FIG. 8C, a light emitting module LM4 may include a plurality of light emitting elements and a circuit board CB having a circuit structure C. Here, two light emitting elements L4a, L4b are included as an example. The first conducting trenches 10a, 10a' and the second conducting trenches 10a, 10b' of the light emitting elements 14a, 14b are provided at the circuit board CD and are electrically connected to the circuit structure C. The two light emitting elements L4a, L4b can be coupled with each other through the circuit structure C. To finish the light emitting module LM4, two lenses 8 are formed at the positions corresponding to the light emitting elements L4a, L4b on the circuit board CB.

To sum up, the light emitting element and the light emitting module utilizing the same according to the invention directly couple to a circuit board or a heat sink, through the first and the second bonding pads of large areas, or the first and the second conducting trenches of large areas, to achieve the objectives of enhancing heat conducting efficiency and simplifying the manufacturing process.

Compared to the prior art, the light emitting element and the light emitting module utilizing the same according to the invention do not need wire bonding, thus do not have the risk of insufficient adhesion force of the wires or the breakage of the wires, and do not have the disadvantage of reduced light emitting amount due to the shield effect of the wires. Compared to the conventional flip-chip light emitting element, the light emitting element according to the invention can be bonded to a circuit board or a heat sink directly without using an expansive and high-precision die-bonding machine. Furthermore, the light emitting element according to the invention does not need a package body of a plastic shell. Therefore, it can be miniaturized without size limitation, and does not suffer from the reliability issues due to the aging of the plastic shell such as PPA or LCP.

Moreover, the variations of the structures of the light emitting elements of different embodiments or aspects can further enhance the light emitting efficiency, increase the light emitting brightness, or simplify the assembly process. Light emitting elements of different colors can also be formed.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A light emitting element comprising:
an epitaxy layer comprising in sequence a first semiconductor layer, an active layer and a second semiconductor layer, wherein the first semiconductor layer has a plurality of exposed portions exposed from the second semiconductor layer and the active layer;
a plurality of first electrodes disposed at the exposed portions;
a plurality of second electrodes disposed at the second semiconductor layer;
a first conducting trench directly connecting the first electrodes; and
a second conducting trench directly connecting the second electrodes.

2. The light emitting element according to claim 1, wherein the first electrodes or the second electrodes have a reflective portion.

3. The light emitting element according to claim 1, further comprising an insulation layer disposed between the first and the second electrodes.

4. The light emitting element according to claim 1, further comprising a passivation layer covering a portion of the first semiconductor layer, a portion of the active layer and a portion of the second semiconductor layer.

5. The light emitting element according to claim 4, further comprising a reflective layer covering the passivation layer.

6. The light emitting element according to claim 1, wherein the epitaxy layer has an inclined surface, the disposition area of the second semiconductor layer is smaller than the active layer, and the disposition area of the active layer is smaller than the first semiconductor layer.

7. The light emitting element according to claim 1, further comprising a substrate, the epitaxy layer being disposed at the substrate.

8. The light emitting element according to claim 7, wherein the surface of the epitaxy layer and/or the substrate has a roughened structure.

9. The light emitting element according to claim 1, further comprising a light transforming layer, the epitaxy layer being disposed at the light transforming layer.

10. The light emitting element according to claim 1, further comprising a light transforming layer, the light transforming layer covering the epitaxy layer, the first conducting trench and the second conducting trench.

11. The light emitting element according to claim 1, further comprising a first extending pad and a second extending pad, the first extending pad being connected with the first conducting trench, the second extending pad being connected with the second conducting trench, the light emitting element being electrically connected with the external through the first extending pad and the second extending pad.

12. The light emitting element according to claim 1, further comprising a lens covering the epitaxy layer and a substrate.

13. A light emitting module comprising:
a plurality of light emitting elements, wherein the light emitting elements are the light emitting elements according to claim 1; and
a circuit board having a circuit structure, the first conducting trenches and the second conducting trenches of the light emitting elements are disposed at the circuit board and are electrically connected with the circuit structure.

14. The light emitting module according to claim 13, wherein, one of the light emitting elements is serially coupled with another of the light emitting elements through the first conducting trench and the second conducting trench.

15. The light emitting module according to claim 13, further comprising a plurality of lenses, the lenses being disposed at the circuit board corresponding to the light emitting elements.

16. A light emitting element comprising:
a plurality of light emitting elements, the light emitting elements are the light emitting elements according to claim 1; and
a heat sink having a circuit structure, wherein the first conducting trench and the second conducting trench of the light emitting elements are disposed at the heat sink and are electrically connected with the circuit structure.

* * * * *